(12) United States Patent
Shih et al.

(10) Patent No.: US 8,076,213 B2
(45) Date of Patent: Dec. 13, 2011

(54) METHOD FOR FABRICATING A METAL-INSULATOR-METAL CAPACITOR

(75) Inventors: Lian-Hua Shih, Chiayi (TW); Yi-Ching Wu, Kao-Hsiung Hsien (TW); Jiann-Fu Chen, Hsin-Chu (TW); Ming-Te Chen, Tai-Chung Hsien (TW); Chin-Jen Cheng, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 179 days.

(21) Appl. No.: 12/554,968

(22) Filed: Sep. 7, 2009

(65) Prior Publication Data
US 2009/0324851 A1    Dec. 31, 2009

Related U.S. Application Data

(62) Division of application No. 11/678,628, filed on Feb. 26, 2007, now Pat. No. 7,606,021.

(51) Int. Cl.
*H01L 21/8242* (2006.01)
(52) U.S. Cl. .......... 438/399; 438/957; 257/E21.011
(58) Field of Classification Search ............ 438/399, 438/909, 954, 957
See application file for complete search history.

(56) References Cited

U.S. PATENT DOCUMENTS

| | | | |
|---|---|---|---|
| 5,483,097 A | 1/1996 | Ohtsuki | |
| 6,100,579 A | 8/2000 | Sonoda | |
| 6,430,028 B1 | 8/2002 | Kar-Roy | |
| 7,294,553 B2 * | 11/2007 | Vogt | 438/381 |

OTHER PUBLICATIONS

Zhang, Processing and Characterisation of PECVD Silicon Nitride Films, 1996, Advenced Materials for Optics and Electronics, vol. 6, pp. 147-150, 1996.
Wolf, Silicon Processing for the VLSI Era, 2000, Lattice Press, vol. 1 Process Technology, pp. 202-203, 2000.
C. H. Ng et al., "Effect of the Nitrous Oxide Plasma Treatment on the MIM Capacitor", Sep. 2002, p. 529-531, vol. 23, No. 9, IEEE Electron Device Letters.

* cited by examiner

*Primary Examiner* — Chandra Chaudhari
(74) *Attorney, Agent, or Firm* — Winston Hsu; Scott Margo

(57) ABSTRACT

A method for fabricating a metal-insulator-metal (MIM) capacitor includes providing a substrate comprising a bottom electrode, forming a dielectric layer positioned on the bottom electrode, and forming a top electrode positioned on the dielectric layer. The dielectric layer includes a silicon nitride film, the silicon nitride film has a plurality of Si—H bonds and a plurality of N—H bonds, and a ratio of Si—H bonds to N—H bonds being equal to or smaller than 0.5.

11 Claims, 14 Drawing Sheets

METHOD FOR FABRICATING A METAL-INSULATOR-METAL CAPACITOR

CROSS REFERENCE TO RELATED APPLICATIONS

This application is a divisional of application Ser. No. 11/678,628 filed Feb. 26, 2007.

BACKGROUND OF THE INVENTION

1. Field of the Invention

The present invention relates to a capacitor, and more particularly to a metal-insulator-metal (MIM) capacitor capable of improving leakage current and breakdown voltage characteristics, and a method for fabricating the same.

2. Description of the Prior Art

In semiconductor integrated circuits (ICs), a semiconductor capacitor may be implemented to provide a capacitive component within the design of a semiconductor integrated device. The applications for these capacitors can include mixed signal (analog/digital) devices, RF (radio frequency) devices, and even decoupling capacitors for the filtering of high frequency signals and improved noise immunization.

One type of semiconductor capacitor structure, called the MIM capacitor, is commonly used in silicon-based processes for its versatility and consistency in reproduction in semiconductor processing. Please refer to FIG. 1. FIG. 1 is a schematic view of forming a capacitor 12 on a semiconductor wafer 10 according to the prior art. As shown in FIG. 1, the semiconductor wafer 10 is provided first. A bottom electrode 14, which is composed of an aluminum (Al) layer 22 on the substrate 11, a titanium (Ti) layer 24 on the aluminum layer 22, and a titanium nitride (TiN) layer 26, is evenly formed. A silicon nitride film and another metal layer are then respectively deposited on the surface of the bottom electrode 14. A lithographic process is performed to define the patterns of a top electrode 18, and excess portions of metal layer and the silicon nitride film are removed to form a dielectric layer 16 and the top electrode 18 so as to finish the formation of the capacitor 12. Generally speaking, the thickness of the prior art aluminum layer 22 is about 350 angstroms, the thickness of the titanium layer 24 is about 50 angstroms, the thickness of the bottom electrode 14 is about 500 angstroms, the thickness of the dielectric layer 16 is about 380 angstroms, and the thickness of the top electrode 18 is about 600 angstroms.

The dielectric layer 16 is formed by means of a prior art CVD process, where an atomic percentage of silicon-hydrogen bonds in the silicon nitride film 16 is about 16.23%, and an atomic percentage of nitride-hydrogen bonds in the silicon nitride film 16 is about 10.98%. Accordingly, the ratio of silicon-hydrogen bonds to nitride-hydrogen bonds is nearly 1.478, and the compressive stress of the silicon nitride film 16 is nearly 2.3 Giga pascals (Gpa).

The capacitance of a capacitor 12 is directly proportional to the dielectric constant of the dielectric layer 16, proportional to the overlapping area of the bottom electrode 14 and the top electrode 18, and inversely proportional to the thickness of the dielectric layer 16. Accordingly, with regard to recent highly integrated devices, dielectric materials with a high dielectric constant have been employed, or the dielectric layer 16 has been deposited to be as thin as possible.

Thus, the capacitance of the capacitor 12 is increased by means of reducing the thickness of the dielectric layer 16. However, in the case of decreasing the thickness of the dielectric layer 16 to increase the capacitance for a capacitor 12, several problems may occur. For example, the leakage current may increase and the breakdown voltage problem deteriorates.

As a result, at the present stage of decreasing the thickness of the dielectric layer 16, a decrease of reliability and production yield is also caused. The performance of the circuit using the capacitor structure 12 will be degraded, and it is difficult to apply the capacitor structure 12 in the semiconductor device.

Accordingly, a dielectric layer having an oxide-nitride-oxide (ONO) structure is applied in the capacitor 12 instead of the silicon nitride dielectric layer 16. Please refer to FIG. 2. FIG. 2 is a schematic view of forming a traditional capacitor 32 on a semiconductor wafer 30. As shown in FIG. 2, the semiconductor wafer 30 includes a substrate 31, and a bottom electrode 34 positioned on the surface of the substrate 31. Subsequently, an oxide film 36a on the surface of the bottom electrode 34, a silicon nitride film 36b on the oxide film 36a, another oxide film 36c on the silicon nitride film 36b, and another metal layer on the silicon nitride film 36b are respectively deposited. The thickness of the oxide film 36a and of the oxide film 36c is about 100 angstroms, and the thickness of the silicon nitride film 36b is about 130 angstroms. A lithographic process is thereafter performed to remove excess portions of the metal layer, the silicon nitride film 36b and the oxide film 36a, 36c, and the top electrode 38 and a dielectric layer 36 are formed to finish the formation of the capacitor 32. The thickness of the bottom electrode 34 is about 500 angstroms, and the thickness of the top electrode 38 is about 600 angstroms.

The dielectric layer 36 is formed by means of traditional CVD processes, where an atomic percentage of silicon-hydrogen bonds in the silicon nitride film 36a is about 21.69%, and an atomic percentage of nitride-hydrogen bonds in the silicon nitride film 36a is about 9.65%. Accordingly, the ratio of silicon-hydrogen bonds to nitride-hydrogen bonds is nearly 2.248, and the tensile stress of the silicon nitride film 36a is nearly 1.93 Gpa.

The dielectric layer 36 having the ONO structure can increase the breakdown voltage. Nevertheless, the improvement of the ONO structure is limited, and the breakdown voltage issue still restricts the performance of the capacitor 32.

SUMMARY OF THE INVENTION

It is therefore one objective of the claimed invention to increase the breakdown voltage of the capacitor structure.

According to the claimed invention, an MIM capacitor is provided. The MIM capacitor includes a bottom electrode, a top electrode and a dielectric layer positioned between the bottom electrode and the top electrode. The dielectric layer includes a silicon nitride film that has a plurality of silicon-hydrogen bonds and a plurality of nitride-hydrogen bonds. A ratio of silicon-hydrogen bonds to nitride-hydrogen bonds is equal to or smaller than 0.5.

According to the claimed invention, a method for fabricating an MIM capacitor is further provided. First, a substrate comprising a bottom electrode is provided. Subsequently, a dielectric layer is formed on the bottom electrode. The dielectric layer comprises a silicon nitride film, the silicon nitride film having a plurality of Si—H bonds and a plurality of N—H bonds. A ratio of Si—H bonds to N—H bonds is equal to or smaller than 0.5. Next, a top electrode is formed on the dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
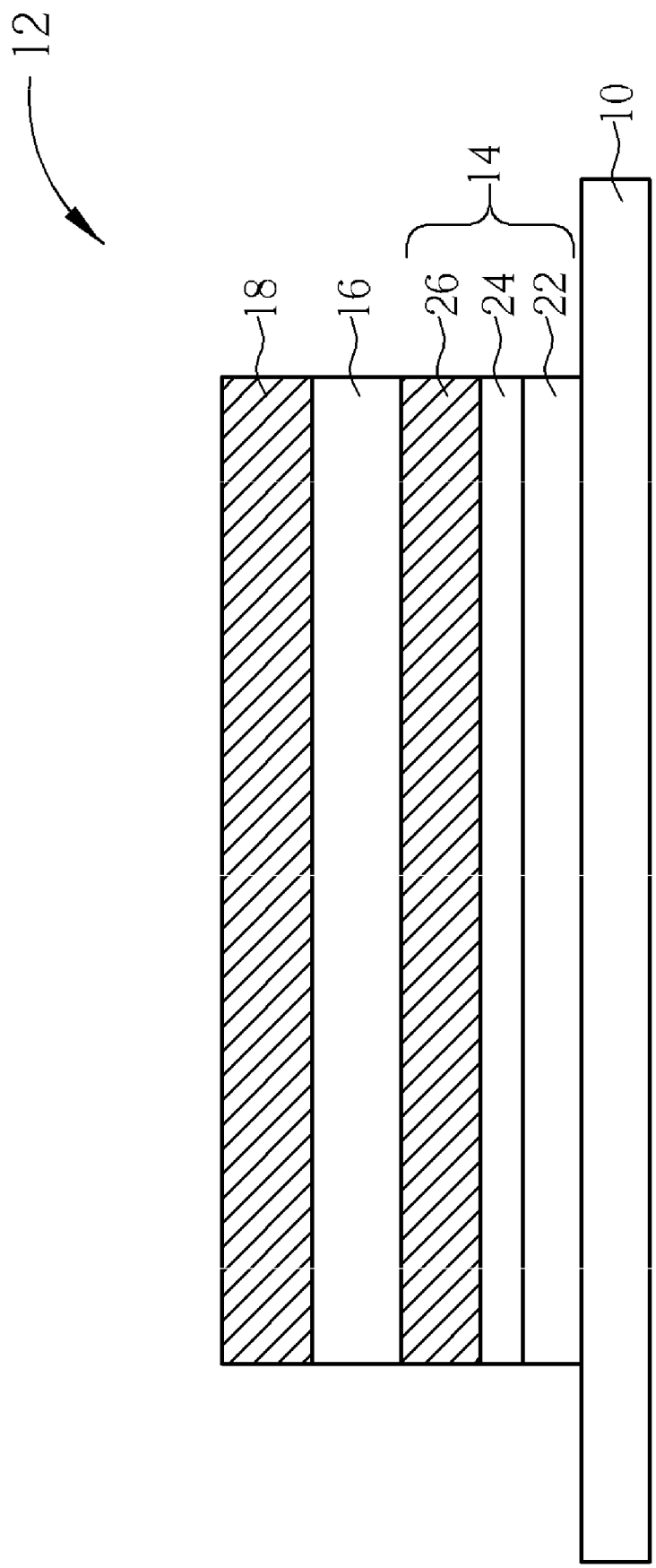
FIG. 1 is a schematic view of forming a capacitor on a semiconductor wafer 10 according to the prior art.

The present invention relates to a method of manufacturing an MIM capacitor. It can be applied to devices such as mixed-signal circuits, radio frequency circuits, low-noise amplifiers, voltage-controlled oscillators, or power amplifiers.

Please refer to FIGS. 3 through 6. FIGS. 3 through 6 are schematic cross-sectional diagrams illustrating a method of manufacturing an MIM capacitor 192 in accordance with a first preferred embodiment of the present invention, wherein like number numerals designate similar or the same parts, regions or elements. It is to be understood that the drawings are not drawn to scale and are only for illustration purposes. In addition, some lithographic and etching processes relating to the present invention method are known in the art and thus not explicitly shown in the drawings.

Figure 3:
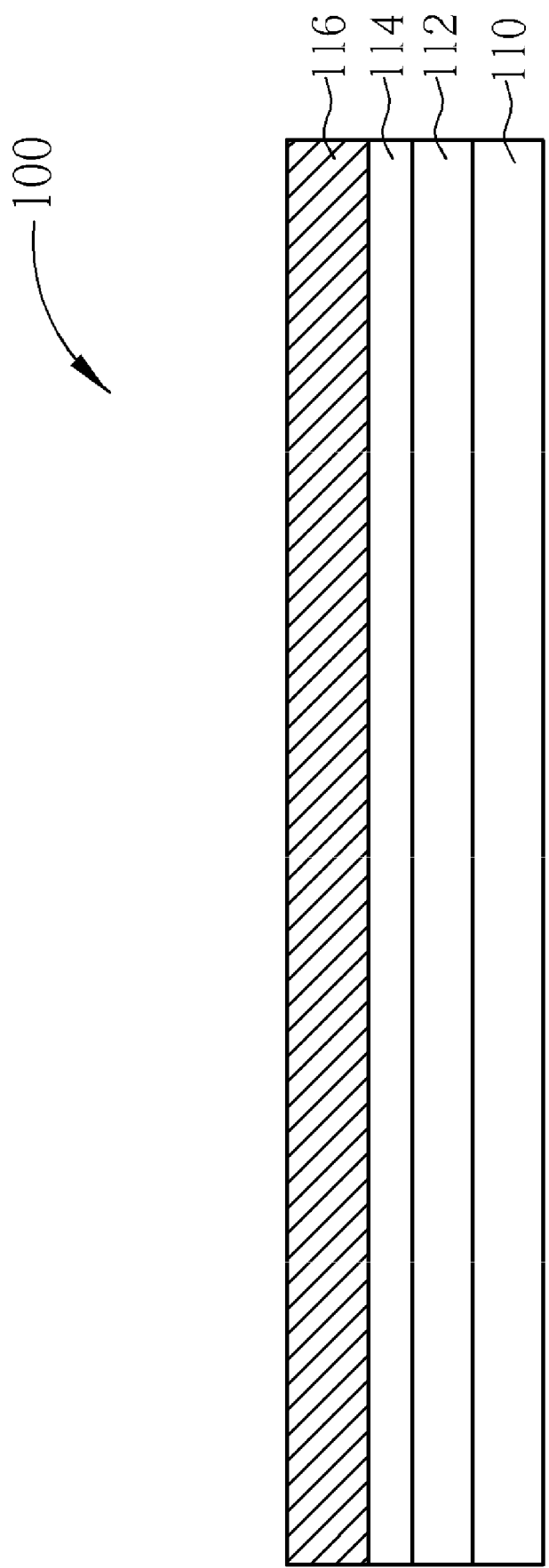
FIG. 3 through FIG. 6 are schematic cross-sectional diagrams illustrating a method of manufacturing an MIM capacitor in accordance with a first preferred embodiment of the present invention.

As shown in FIG. 3, a semiconductor wafer 100 including a substrate 110 is provided first. The substrate 110 may be a silicon substrate or a silicon-on-insulator (SOI) substrate, but this is not limited. According to the preferred embodiment of the present invention, a metal layer 112 can be deposited optionally on the substrate 110, a barrier layer 114 can be deposited optionally on the metal layer 112, and a conducting layer 116 can be deposited on the surface of the barrier layer 114. The metal layer 112 can include metals, such as copper, aluminum, and tungsten, or alloys of the above-mentioned metals. The barrier layer 114 can include different combinations of tantalum (Ta), tantalum nitride (TaN), titanium (Ti), and titanium nitride. In addition, the conducting layer 116 can include conductive materials, such as titanium nitride.

Figure 4:
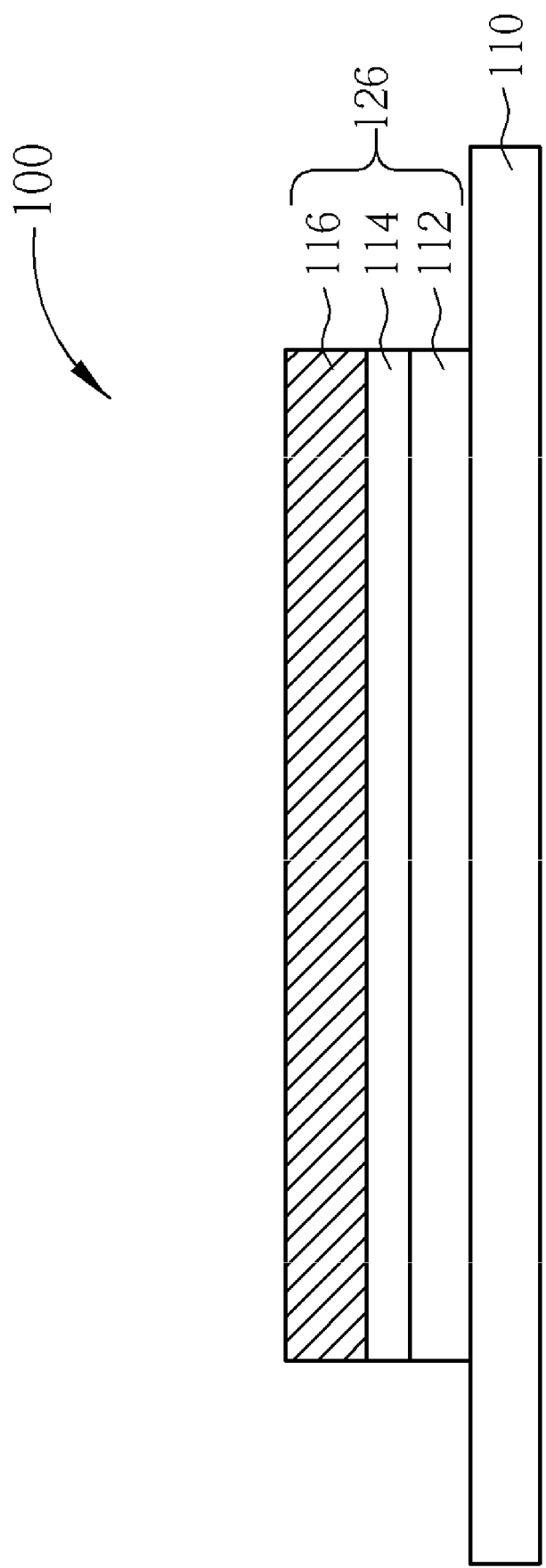

Subsequently, as shown in FIG. 4, a patterning process is performed on the conducting layer 116, the barrier layer 114 and the metal layer 112. The patterning process includes: (1) coating a photoresist layer (not shown in the figure) on the surface of the conducting layer 116; (2) performing a lithographic and etching process to transfer a pattern of a photo mask to the photoresist layer, and to transfer the pattern of the photoresist layer to the conducting layer 116, the barrier layer 114 and the metal layer 112; and (3) removing the patterned photoresist layer. As a result, the remaining part of the conducting layer 116, the remaining part of the barrier layer 114, and the remaining part of the metal layer 112 form a bottom electrode 126 of the MIM capacitor 192.

Figure 5:
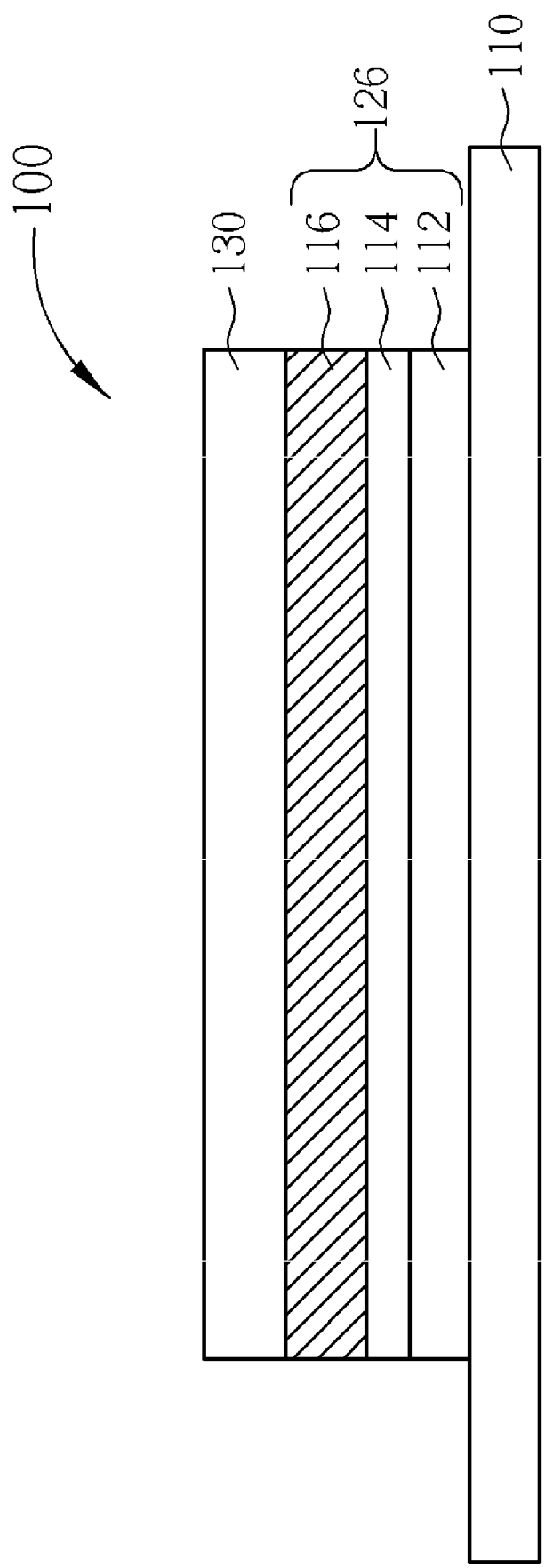

As shown in FIG. 5, a dielectric layer 130 is deposited on the substrate 110. The dielectric layer 130 can be formed by a plasma enhanced chemical vapor deposition (PECVD) process, and can thereafter be patterned by a patterning process. In this embodiment, the dielectric layer 130 of the capacitor 192 is a silicon nitride film 120.

The silicon nitride film 120 has a plurality of silicon-hydrogen bonds and a plurality of nitride-hydrogen bonds. It should be noted that a ratio of silicon-hydrogen bonds to nitride-hydrogen bonds is equal to or smaller than 1:2. In this embodiment, the silicon nitride film 120 is deposited in a PECVD process, where $SiH_4$, $NH_3$ and $N_2$ flow into the PECVD reactor. The flow-in rate of $SiH_4$ in the PECVD process is approximately 225 standard cubic centimeters per minute (SCCM), the flow-in rate of $NH_3$ is about 1.2 SCCM, and the flow-in rate of $N_2$ is about 12 SCCM. The low frequency (LF) power of the PECVD reactor is nearly 100 watts (W), and the high frequency (HF) power is nearly 700 W, where the pressure in the reactor is about 2600 milli-torrs (mtorr). According to these parameters, an atomic percentage of silicon-hydrogen bonds in the formed silicon nitride film 120 is about 2.38%, and an atomic percentage of nitride-hydrogen bonds in the silicon nitride film 120 is about 14.34%. Thus, the ratio of silicon-hydrogen bonds to nitride-hydrogen bonds is nearly 0.5, and the compressive stress of the silicon nitride film 120 is nearly 4.5 Gpa.

The above-mentioned PECVD process is just an example of forming the dielectric layer 130, and a person skilled in this art should understand that the parameters should not be limited to the above-mentioned PECVD process. According to experience data, the flow-in rate of $SiH_4$ in the PECVD process is between 100 SCCM and 225 SCCM. The flow-in rate of $NH_3$ is between 1.2 SCCM and 4000 SCCM, and the flow-in rate of $N_2$ is between 10 SCCM and 14 SCCM. The LF power of the PECVD reactor is between 100 W and 500 W, and the HF power is between 630 W and 770 W, where the pressure in the reactor is 2340 mtorr and 2860 mtorr. According to these parameters, an atomic percentage of silicon-hydrogen bonds in the formed silicon nitride film 120 is equal to or smaller than 2.38%, and an atomic percentage of nitride-hydrogen bonds in the silicon nitride film 120 is equal to or lager than 14.34%. Thus, the compressive stress of the silicon nitride film 120 is equal to or lager than 1 Gpa.

Figure 6:
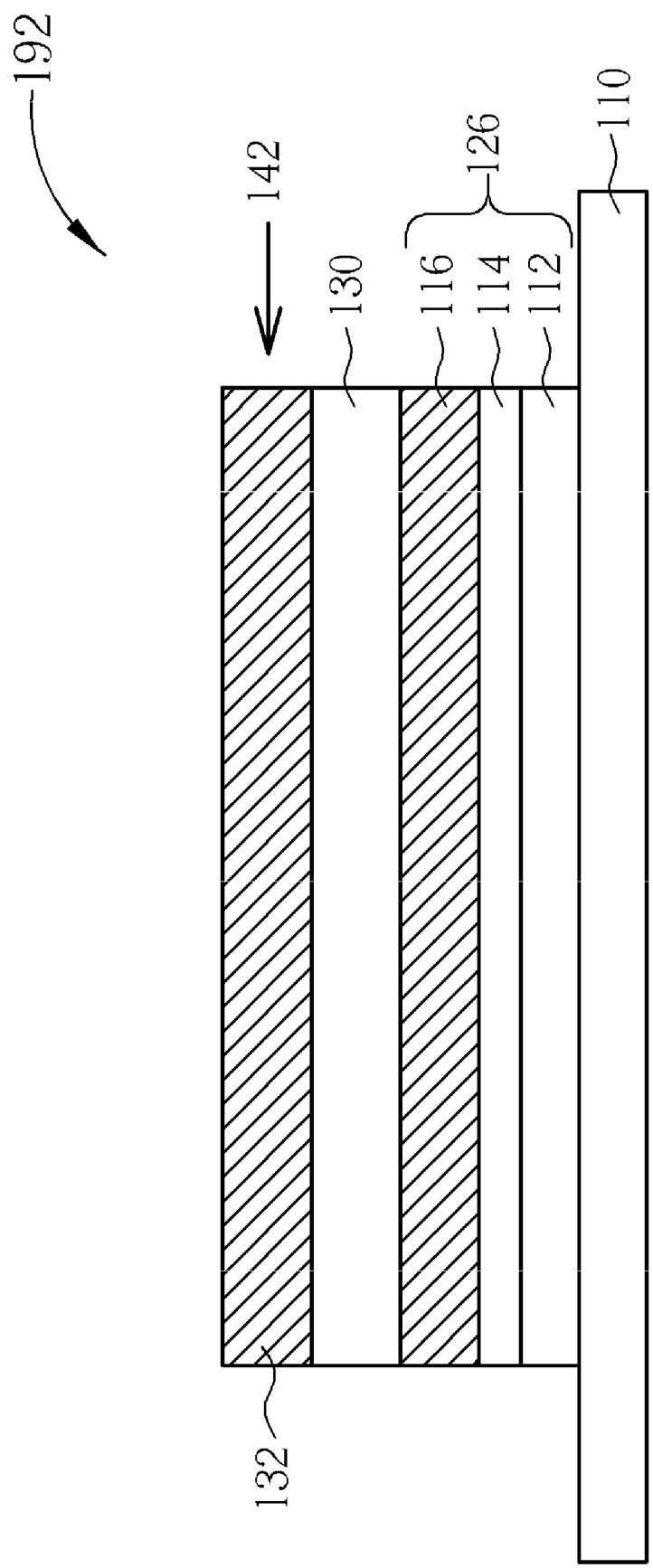

As shown in FIG. 6, another conducting layer 132 is deposited on the surface of the dielectric layer 130, and a patterning process is thereafter performed to form a top electrode 142 so as to finish the formation of the capacitor 192. The thickness of the bottom electrode 126 is about 500 angstroms, the thickness of the dielectric layer 130 is about 380 angstroms, and the thickness of the top electrode 142 is about 600 angstroms.

In the first embodiment, the layers of the bottom electrode 126 are patterned in the same time, and the top electrode 142 and the dielectric layer 130 are patterned in the same time. However, a person skilled in this art should understand that the etching processes should not be limited to this embodiment. Each layer in the structure of the present invention can be etched through an independent etching process, or any adjacent layers may be etched together through one etching process.

Figure 7:
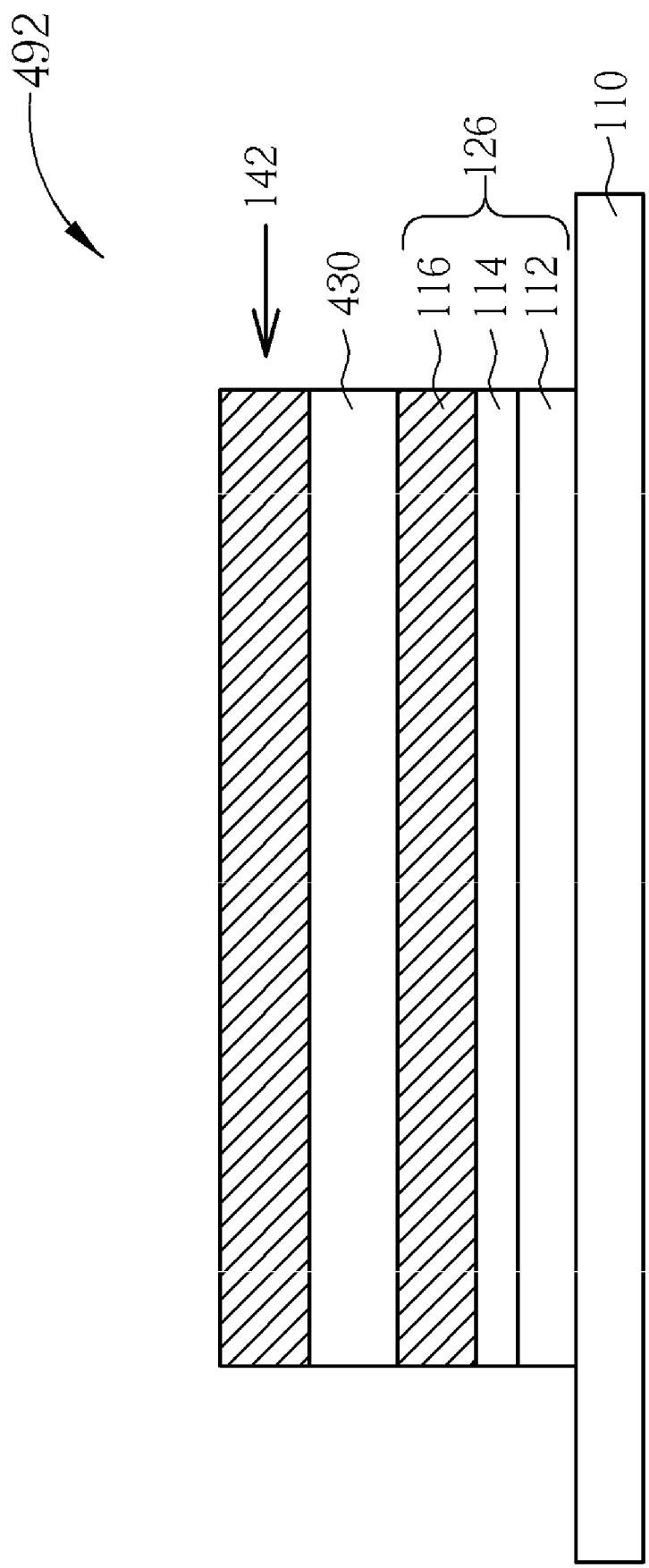
FIG. 7 is a schematic cross-sectional diagram illustrating an MIM capacitor in accordance with a second preferred embodiment of the present invention.

Please refer to FIG. 7. FIG. 7 is a schematic cross-sectional diagram illustrating an MIM capacitor 492 in accordance with a second preferred embodiment of the present invention, wherein like number numerals designate similar or the same parts, regions or elements. As shown in FIG. 7, the MIM capacitor 492 includes a bottom electrode 126, a top electrode 142 and a dielectric layer 430 positioned between the bottom electrode 126 and the top electrode 142. The main difference between the MIM capacitor 492 and the MIM capacitor 192 is that the compressive stress of the dielectric layer 430 is nearly 0.596 Gpa.

Figure 8:
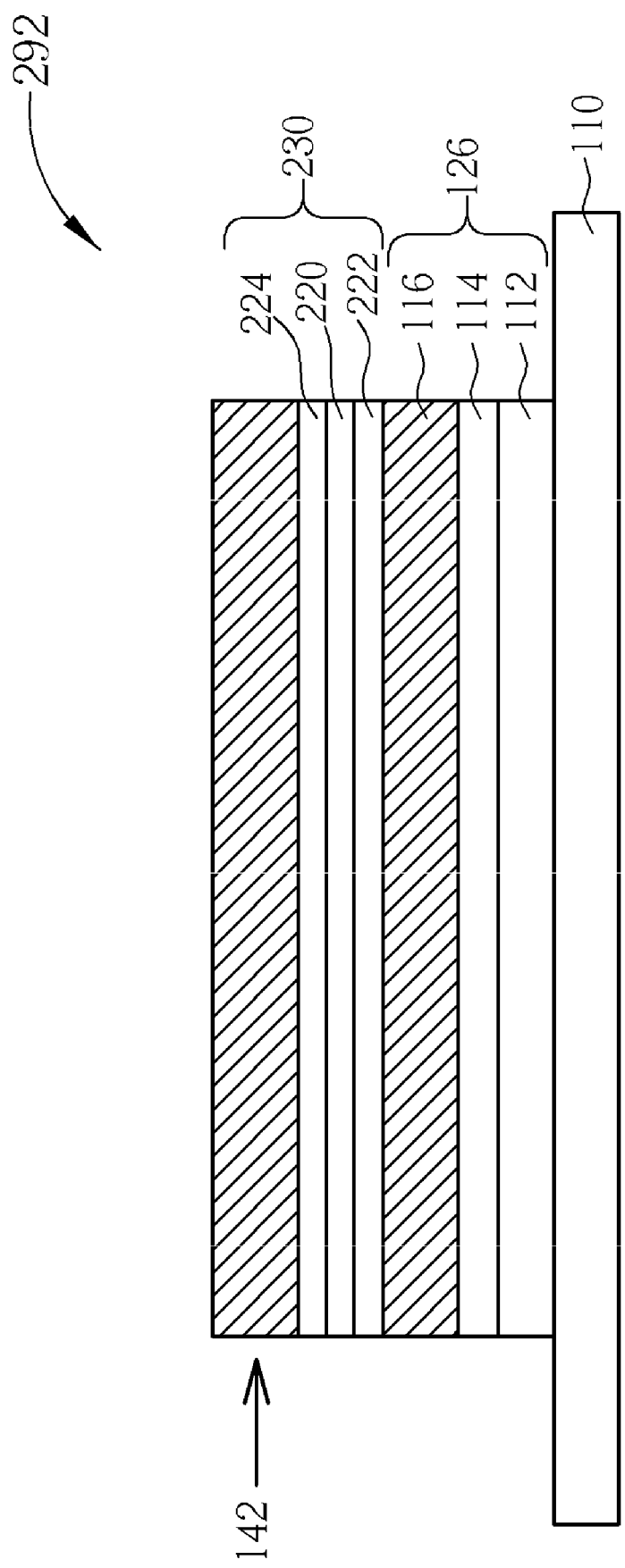
FIG. 8 is a schematic cross-sectional diagram illustrating an MIM capacitor in accordance with a third preferred embodiment of the present invention.

Please refer to FIG. 8. FIG. 8 is a schematic cross-sectional diagram illustrating an MIM capacitor 292 in accordance with a third preferred embodiment of the present invention, wherein like number numerals designate similar or the same parts, regions or elements. As shown in FIG. 8, the MIM capacitor 292 includes a bottom electrode 126, a top electrode 142 and a dielectric layer 230 positioned between the bottom electrode 126 and the top electrode 142. The main difference between the MIM capacitor 292 and the MIM capacitor 192 is that the dielectric layer 230 includes an oxide-nitride-oxide (ONO) structure instead of including just the silicon nitride film 120. In other words, the dielectric layer 230 includes a silicon nitride film 220 and two oxide films 222 and 224. The silicon nitride film 220 is positioned between the oxide film 222 and the oxide film 224. In the silicon nitride film 220, the ratio of silicon-hydrogen bonds to nitride-hydrogen bonds is equal to or smaller than 1:2. The forming process of the dielectric layer 230 includes depositing an oxide film 222 on the bottom electrode 226, depositing a silicon nitride film 220 on the oxide film 222, depositing another oxide film 224 on the silicon nitride film 220, and patterning the silicon nitride film 220 and the two oxide films 222 and 224. The silicon nitride film 220 of the dielectric layer 230 can be manufactured by means of the above-mentioned PECVD process.

Figure 2:
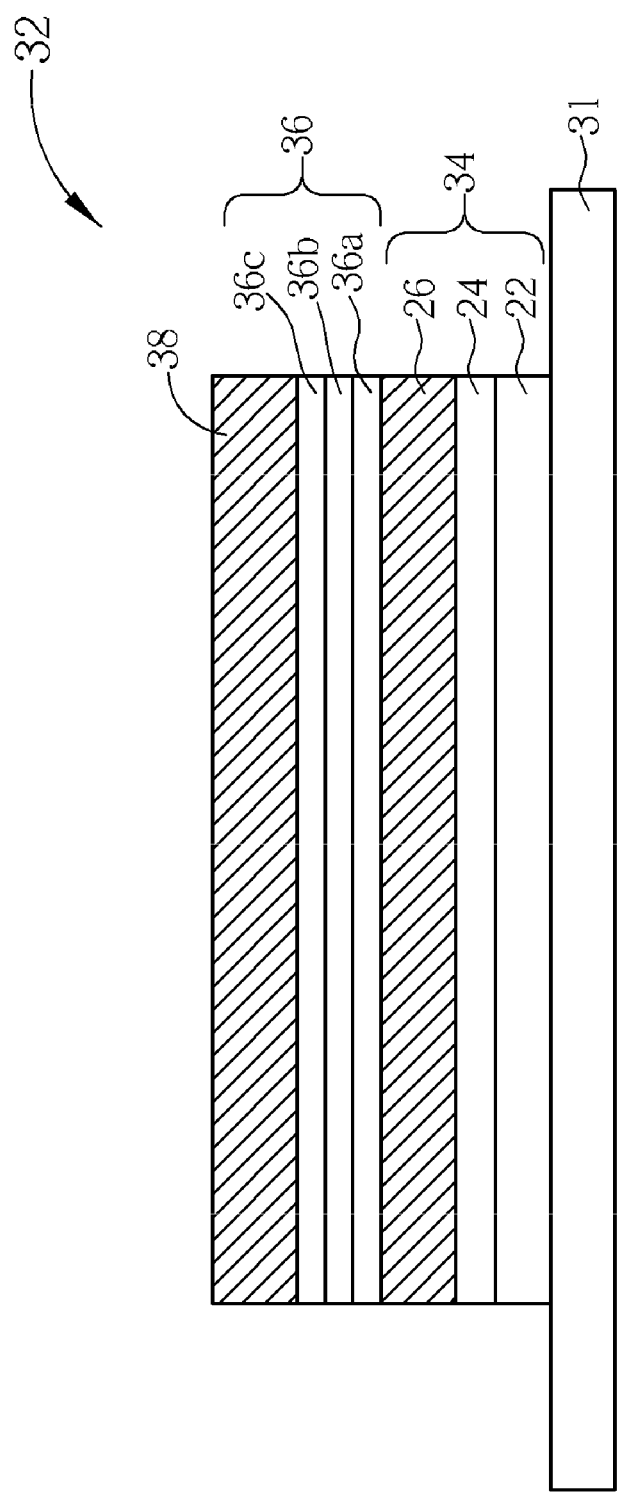
FIG. 2 is a schematic view of forming a traditional capacitor on a semiconductor wafer.
Figure 9:
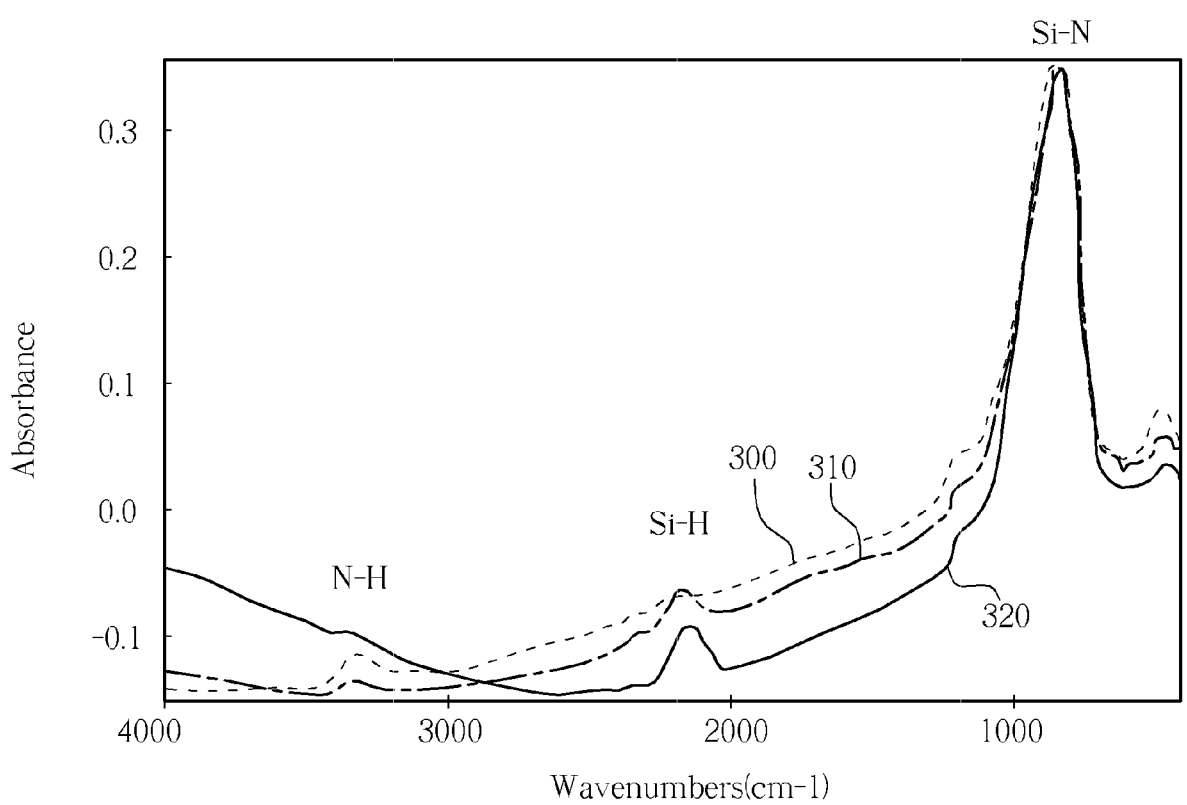
FIG. 9 represents relationships between absorbance and wave numbers of different dielectric layers.

The silicon nitride film with nitrogen-rich and compressive stress can improve the breakdown voltage of the MIM capacitor. The following figures are schematic diagrams illustrating comparisons between different capacitors. Please refer to FIG. 9. FIG. 9 represents relationships between absorbance and wave numbers of different dielectric layers, where the relationship between absorbance and wave numbers for each dielectric layer is measured by Fourier transform infrared (FTIR) equipment. As shown in FIG. 9, the curve 300 represents the chemical bonds of the dielectric layer 130 in the capacitor 192 shown in FIG. 6, the curve 310 represents the chemical bonds of the dielectric layer 16 in the capacitor 12 shown in FIG. 1, and the curve 320 represents the chemical bonds of the dielectric layer 36 in the capacitor 32 shown in FIG. 2. Each peak of the curves 300, 310 and 320 stands for a chemical bond of the dielectric layers 130, 16 and 36 respectively. As the peak gets higher, the quantity of the chemical bond gets larger. The peaks having wave numbers around 3400 $cm^{-1}$, stand for the nitride-hydrogen bond. The peaks having wave numbers around 2200 $cm^{-1}$ stand for the silicon-hydrogen bond. The peaks having wave numbers about 800 $cm^{-1}$ stand for the silicon-nitride bond. The ratio of silicon-hydrogen bonds to nitride-hydrogen bonds in the dielectric layer 130 is rarely small. Accordingly, the ratio of silicon-hydrogen bonds to nitride-hydrogen bonds in the dielectric layer 130 is smaller than that in the dielectric layer 16, and the ratio of silicon-hydrogen bonds to nitride-hydrogen bonds in the dielectric layer 16 is smaller than that in the dielectric layer 36.

Figure 10:
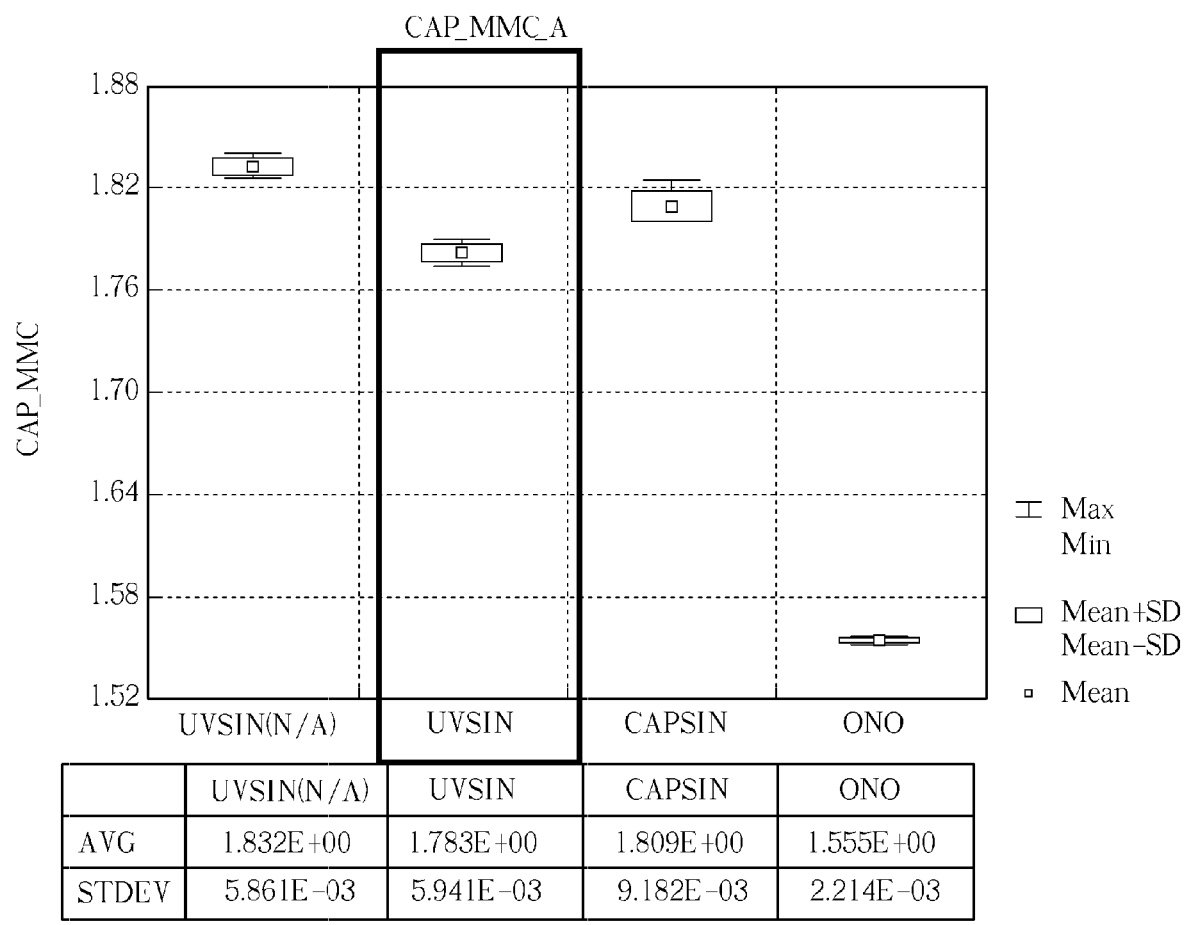
FIG. 10 represents capacitances of different dielectric layers.
Figure 11:
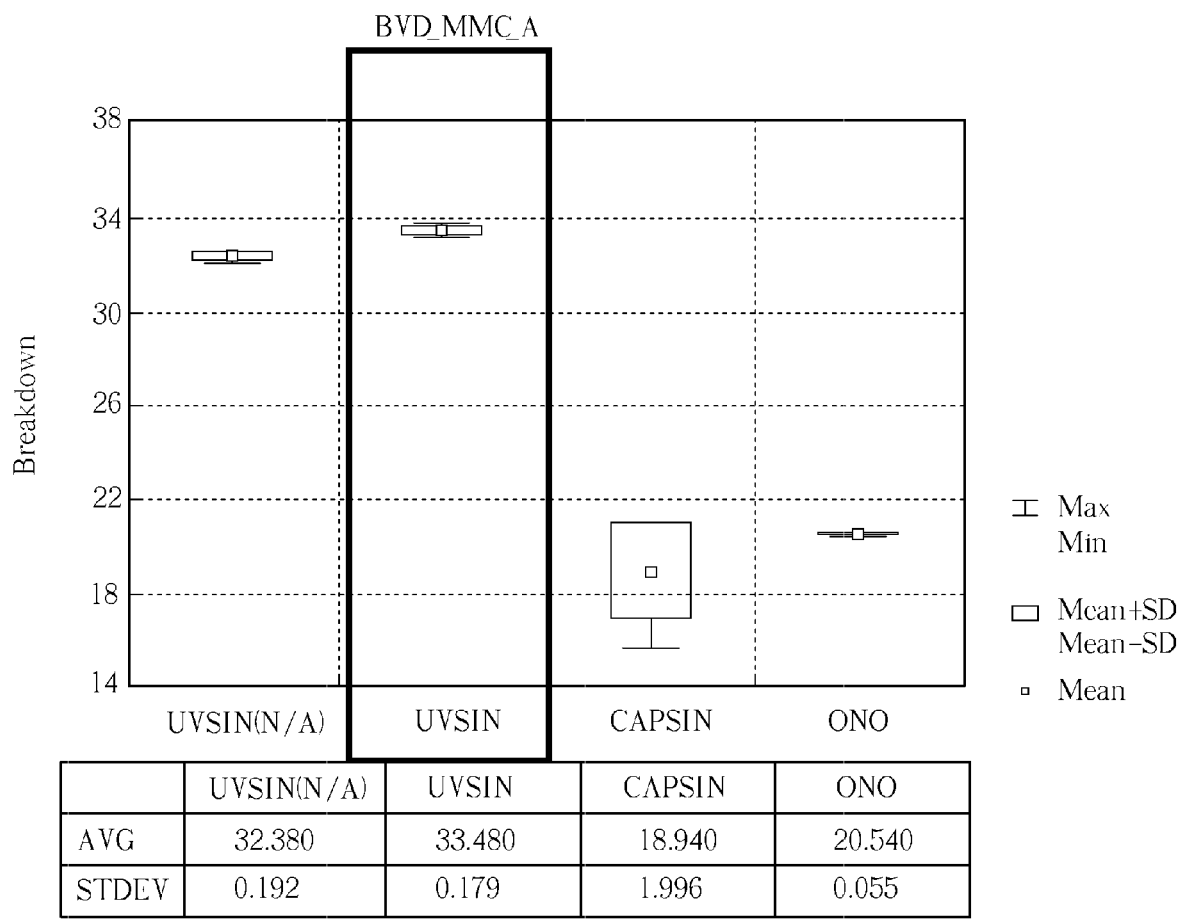
FIG. 11 represents breakdown voltages of different dielectric layers.

Please refer to FIG. 10 and FIG. 11. FIG. 10 represents capacitances of different dielectric layers, and FIG. 11 represents breakdown voltages of different dielectric layers, where the capacitances and the breakdown voltages are measured by a wafer acceptance testing (WAT) equipment. The mark "UVSIN (N/A)" stands for a capacitor having a dielectric layer of another preferred embodiment of the present invention, where the mark "UVSIN" represents the capacitor 192 having the dielectric layer 130 shown in FIG. 6, the mark "CAPSIN" represents the capacitor 12 having the dielectric layer 16, and the mark "ONO" represents the capacitor 32 having the dielectric layer 36. The main difference between the capacitor named UVSIN (N/A) and the capacitor 192 is that the capacitor 192 undergoes an $NH_3$ treatment. As shown in FIG. 10, the capacitance of the capacitor named UVSIN (N/A) and that of the capacitor named UVSIN are larger than the capacitance of the capacitor named ONO. As shown in FIG. 11, the breakdown voltage of the capacitor named UVSIN (N/A) and that of the capacitor named UVSIN are larger than the breakdown voltage of the capacitor named ONO and that of the capacitor named CAPSIN. From the WAT data, the breakdown voltage of the capacitor named ONO is about 20.54 volts (V) at 1 microampere (mA). The breakdown voltage of the capacitor named UVSIN is about 33 volts at 1 microampere. As a result, the nitrogen-rich silicon nitride film has better film quality (high capacitance and high breakdown voltage) in the capacitor.

Figure 12:
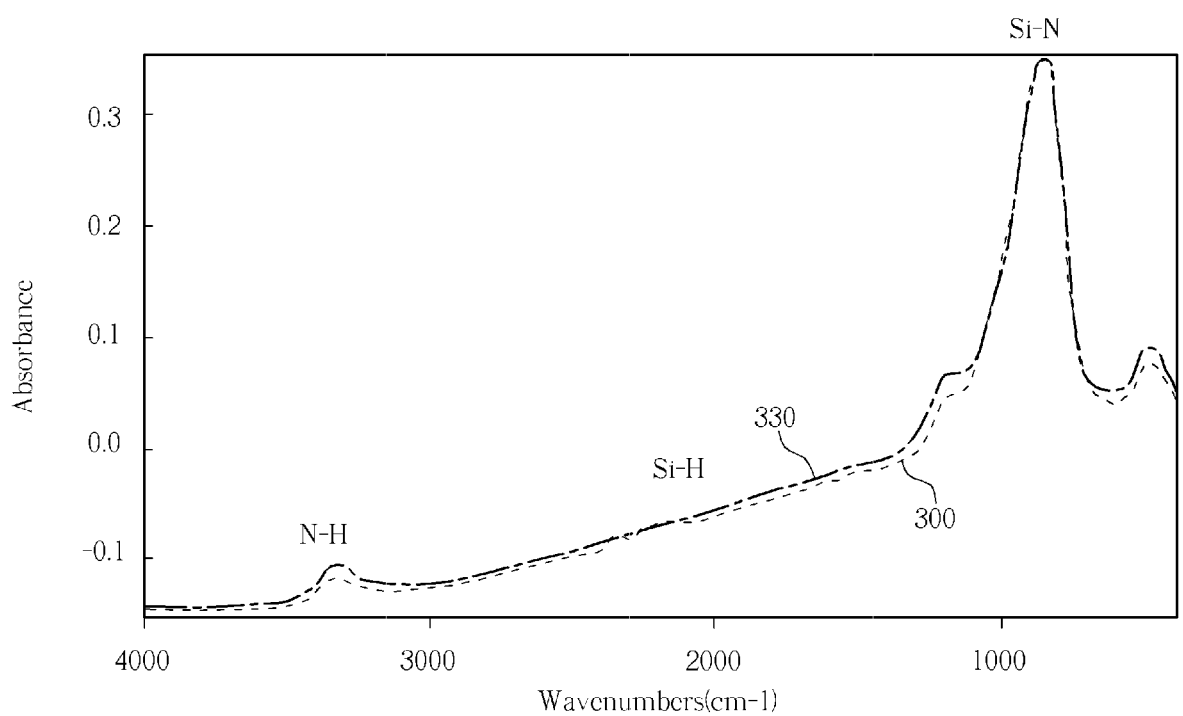
FIG. 12 represents relationships between absorbance and wave numbers of different dielectric layers of the present invention.

Please refer to FIG. 12. FIG. 12 represents relationships between absorbance and wave numbers of different dielectric layers of the present invention, where the relationship between the absorbance and the wave numbers for each dielectric layer is measured by FTIR equipment. The curve 300 represents the chemical bonds of the dielectric layer 130 in the capacitor 192 shown in FIG. 6, and the curve 330 represents the chemical bonds of the dielectric layer 430 in the capacitor 432 shown in FIG. 7. As shown in FIG. 12, the ratios of silicon-hydrogen bonds to nitride-hydrogen bonds in the dielectric layer 130 and that in the dielectric layer 430 is rarely small. Accordingly, the ratio of silicon-hydrogen bonds to nitride-hydrogen bonds in the dielectric layer 130 is smaller than that in the dielectric layer 430.

Figure 13:
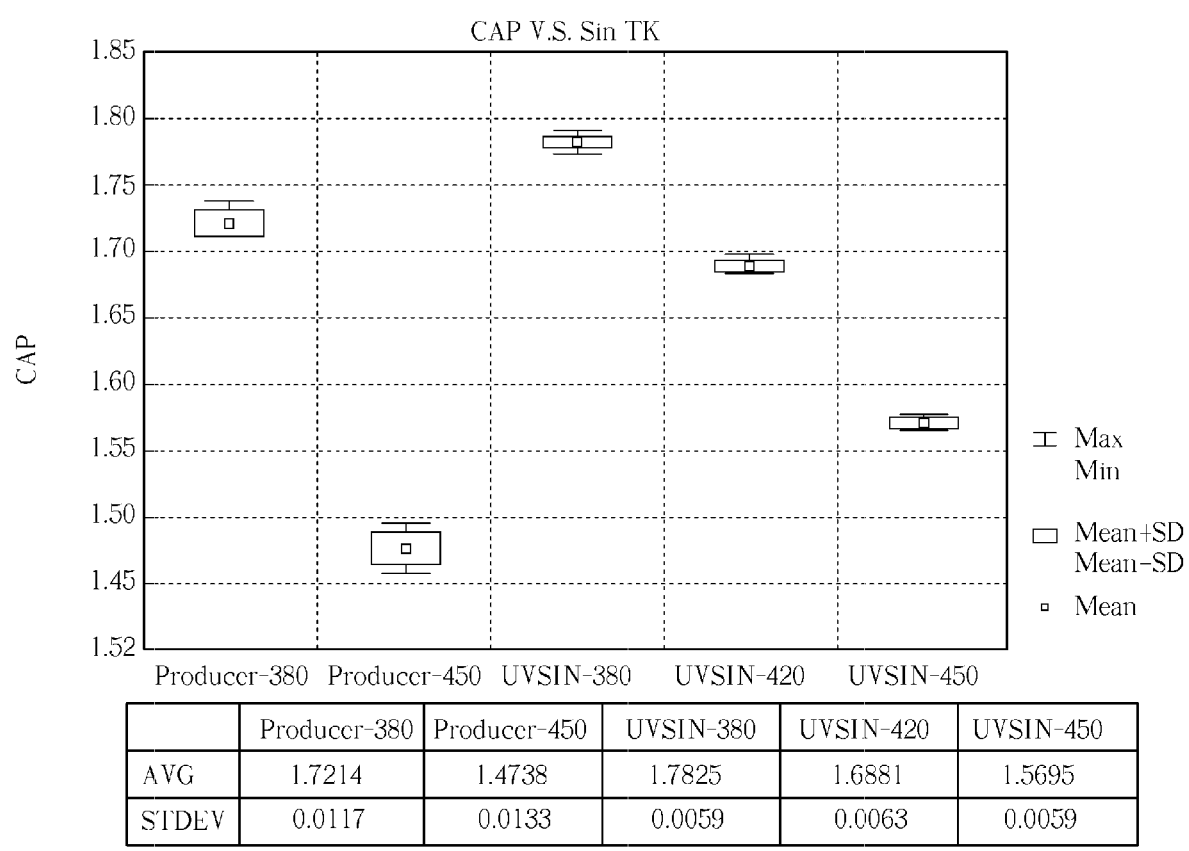
FIG. 13 represents capacitances of different dielectric layers of the present invention.
Figure 14:
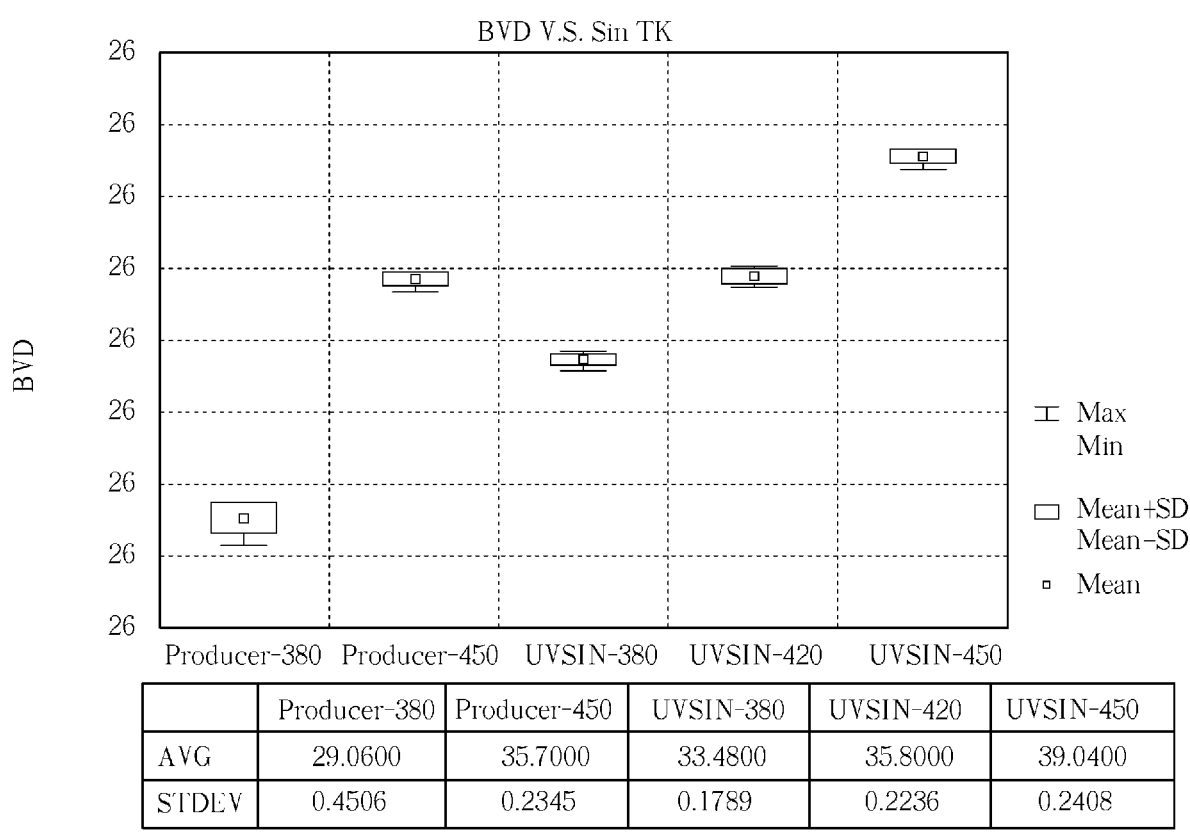
FIG. 14 represents breakdown voltages of different dielectric layers in the present invention.

Please refer to FIG. 13 and FIG. 14. FIG. 13 represents capacitances of different dielectric layers of the present invention, and FIG. 14 represents breakdown voltages of different dielectric layers in the present invention, where the capacitances and the breakdown voltages are measured by WAT equipment. The mark "Producer" stands for the capacitor 432 having the dielectric layer 430 shown in FIG. 7, and the mark "UVSIN" represents the capacitor 192 having the dielectric layer 130 shown in FIG. 6. Each number marked after "Producer" or "UVSIN" shows the thickness of the dielectric layer. For example, the mark "UVSIN-380" represents that the capacitor 192 has the dielectric layer 130, and the thickness of the dielectric layer 130 is 380 angstroms.

As shown in FIG. 13, the capacitance of the capacitor 192 having the dielectric layer 130 is higher than that of the capacitor 432 having the dielectric layer 430 under the same thickness. Moreover, as the dielectric layer gets thinner, the capacitance of the capacitor gets higher. As shown in FIG. 14, the breakdown voltage of the capacitor 192 having the dielectric layer 130 is higher than that of the capacitor 432 having the dielectric layer 430 under the same thickness. In addition, as the dielectric layer gets thinner, the breakdown voltage of the capacitor gets higher. As a result, the silicon nitride film getting the higher compressive stress has better film quality in the capacitor, and the film quality can be adjusted by changing the thickness of the dielectric layer.

According to the present invention, it is a great convenience that the silicon nitride film with nitrogen-rich and compressive stress can be formed easily through a PECVD process, and the silicon nitride film with nitrogen-rich and compressive stress can increase the breakdown voltage of the MIM capacitor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a metal-insulator-metal (MIM) capacitor comprising:

providing a substrate comprising a bottom electrode;

forming a dielectric layer positioned on the bottom electrode, the dielectric layer comprising a silicon nitride film, the silicon nitride film having a plurality of Si—H bonds and a plurality of N—H bonds, a ratio of Si—H bonds to N—H bonds being equal to or smaller than 0.5; and forming a top electrode positioned on the dielectric layer.

2. The method of claim 1, wherein the dielectric layer is formed by means of a chemical vapor depositing process (CVD process).

3. The method of claim 1, wherein the dielectric layer is formed by means of a plasma enhanced chemical vapor depositing process (PECVD process).

4. The method of claim 2, wherein the CVD process is performed in a reactor, and $SiH_4$, $NH_3$ and $N_2$ flow into the reactor.

5. The method of claim 2, wherein a flow-in rate of $SiH_4$ in the CVD process is between 100 standard cubic centimeters per minute (SCCM) and 225 SCCM.

6. The method of claim 2, wherein a flow-in rate of $NH_3$ in the CVD process is between 1.2 SCCM and 4000 SCCM.

7. The method of claim 2, wherein a flow-in rate of $N_2$ in the CVD process is between 10 SCCM and 14 SCCM.

8. The method of claim 2, wherein a low frequency power of the CVD process is between 100 watts (W) and 500 W.

9. The method of claim 2, wherein a high frequency power of the CVD process is between 630 W and 770 W.

10. The method of claim 2, wherein a pressure in the CVD process is between 2340 milli-torrs (mtorr) and 2860 mtorr.

11. The method of claim 1, wherein the bottom electrode and the top electrode are comprised of polysilicon, aluminum, aluminum-copper alloy, or copper.

* * * * *